United States Patent [19]

Griffith

[11] Patent Number: 4,857,867

[45] Date of Patent: Aug. 15, 1989

[54] METHOD AND APPARATUS FOR LOCKING THE FREQUENCY AND PHASE OF A LOCAL OSCILLATOR

[75] Inventor: Paul G. Griffith, Dallas, Tex.

[73] Assignee: Mobil Oil Corporation, New York, N.Y.

[21] Appl. No.: 240,325

[22] Filed: Sep. 6, 1988

[51] Int. Cl.$^4$ .......................... H03L 7/06; G01V 1/00
[52] U.S. Cl. .......................................... 331/10; 331/25; 364/421; 367/45
[58] Field of Search ....................... 331/10, 17, 18, 23, 331/25; 329/50, 107, 110, 122, 136; 375/14, 15, 78, 80, 81, 99, 120; 455/208, 209, 214, 260, 265, 303, 304, 305, 306, 312; 364/421; 367/45

[56] References Cited

U.S. PATENT DOCUMENTS

| | | | |
|---|---|---|---|
| 3,889,108 | 6/1975 | Cantrell | 235/152 |
| 4,501,004 | 2/1985 | Yoshida et al. | 455/306 X |

OTHER PUBLICATIONS

Widrow et al., Bernard, "Adaptive Noise Cancelling: Principles and Applications", *Proceedings of the IEEE*, vol. 63, No. 12, Dec. 1975.
Widrow, Bernard and Sterns, S. D., *Adaptive Signal Processing*, Prentice-Hall, Inc., 1985, pp. 99–116 and 316–337.
Glover, J. R., *Adaptive Noise Cancelling of Sinusoidal Interference*, Stanford University, University Microfilms International, 1986, pp. 30–34 and 64–72.

*Primary Examiner*—David Mis
*Attorney, Agent, or Firm*—Alexander J. McKillop; Charles J. Speciale; George W. Hager, Jr.

[57] ABSTRACT

The output of a local oscillator is applied to an external signal to produce a feedback error signal. The feedback error signal is utilized in adjusting the phase, frequency and amplitudes parameters of the local reference sine-cosine quadrature components which comprise the output of the local oscillator signal. Adjusting the parameters modifies the output of the local oscillator. The modified output of the local oscillator is applied to the external signal to continuously modify the feedback error signal, which in turn, continuously modifies the output of the local oscillator until the frequency and phase of the local oscillator signal is locked to that of the external signal.

13 Claims, 8 Drawing Sheets

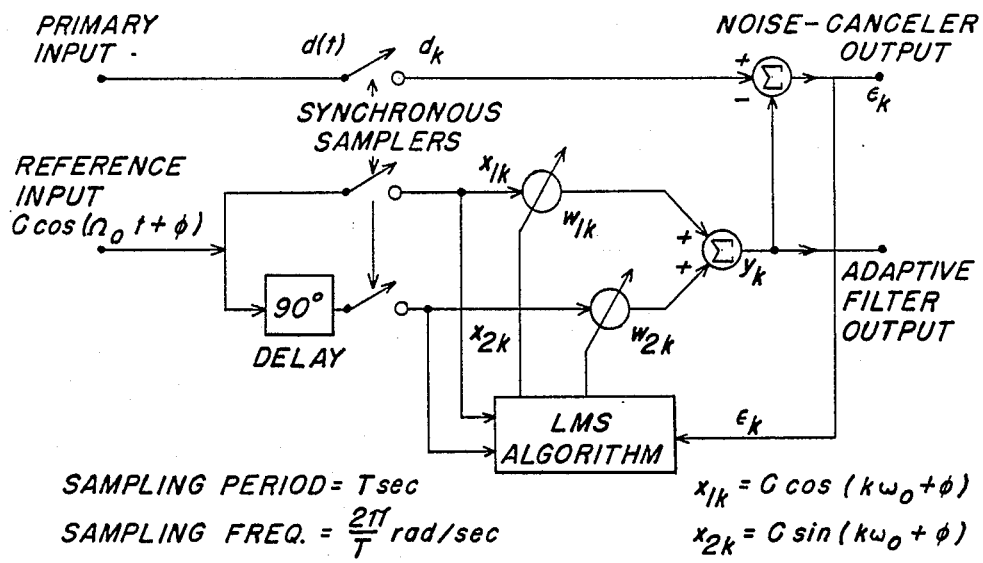
PRIOR ART  FIG. 1
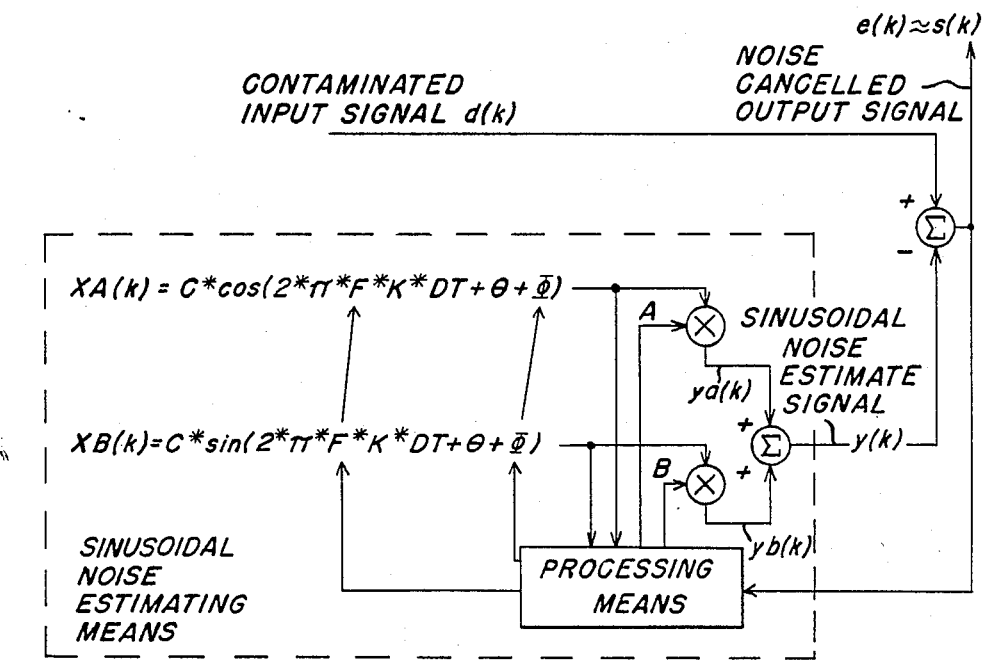
FIG. 2

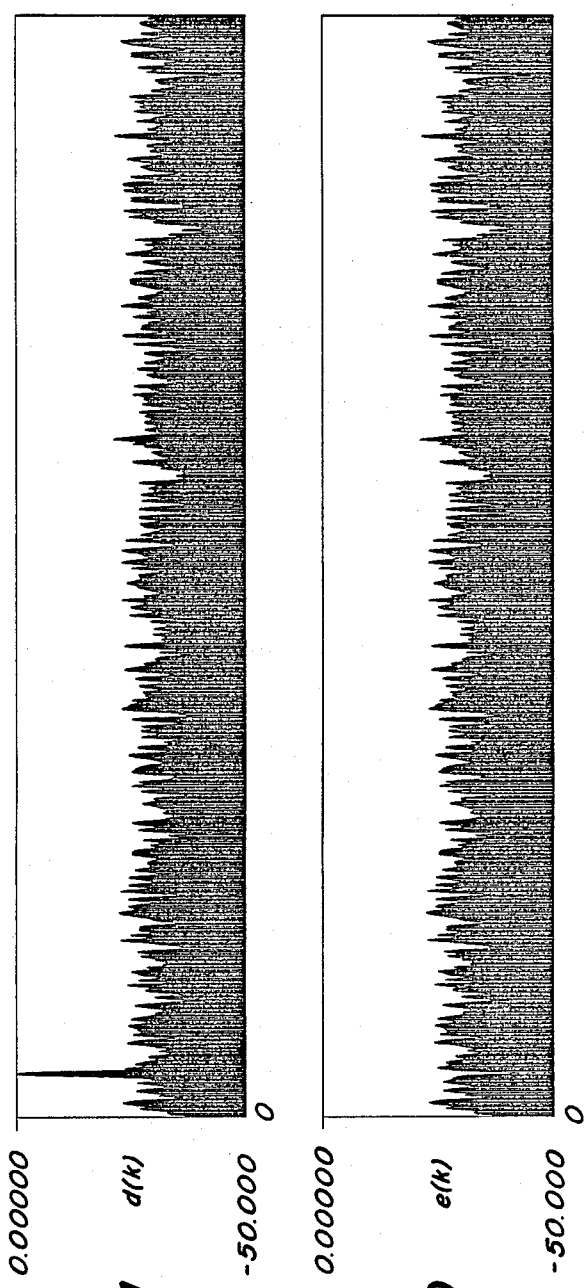

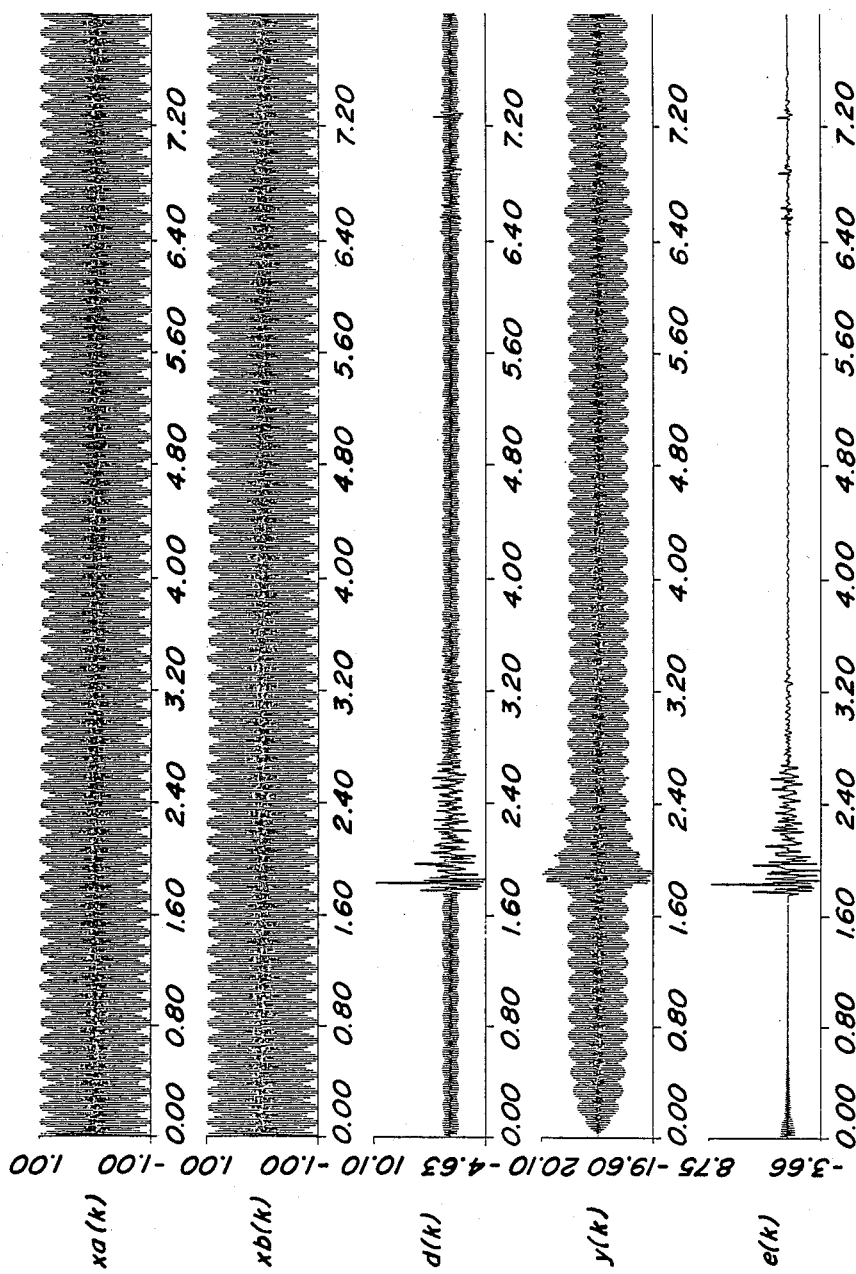

METHOD AND APPARATUS FOR LOCKING THE FREQUENCY AND PHASE OF A LOCAL OSCILLATOR

RELATED APPLICATION

This application is related to U.S. patent application Ser. No. 240,305, filed simultaneously with this application.

BACKGROUND OF THE INVENTION

1. Field of the Invention

This invention relates to an adaptive method and apparatus for locking the frequency and phase of a local oscillator. More specifically, this invention relates to a method and apparatus for adaptively locking the frequency and phase of a local oscillator with that of an external signal.

2. Description of the Prior Art

In seismic exploration, it is common practice to deploy a large array of geophones on the surface of the earth and to record the vibrations of the earth at each geophone location to obtain a collection of seismic traces. The traces are sampled and recorded for further processing. When the vibrations so recorded are caused by a seismic source activated at a known time and location, the recorded data can be processed by a computer in known ways to produce an image of the subsurface. The image thus produced is commonly interpreted by geophysicists to detect the possible presence of valuable hydrocarbons.

Seismograms are commonly recorded as digital samples representing the amplitude of a received seismic signal as a function of time. Since seismograms are usually obtained along a line of exploration on the surface of the earth, the digital samples can be formed into x-t arrays with each sample in the array representing the amplitude of the seismic signal as a function of horizontal distance and time. When such arrays are Visually reproduced, by plotting or the like, seismic sections are produced. A seismic section depicts the subsurface layering of a section of the earth. It is the principal tool which the geophysicist studies to determine the nature of the earth's subsurface formations. Before an array of seismic samples or traces can be converted into a seismic section for interpretation by geophysicists, the array must be extensively processed to remove noise and to make reflection events discernible.

In the course of seismic exploration, a significant amount of noise is introduced into the seismic data by the influence of man. Such introduced noise, which may include noise from power lines, electrical machinery or other sources, is generally referred to as "cultural noise". The usual method of estimating a signal corrupted by additive noise is to pass it through a filter that tends to suppress the noise while leaving the signal relatively unchanged. Filters for this purpose may be either fixed or adaptive. The design of fixed filters is based on prior knowledge of both the signal and the noise. The traditional method of removing narrow band noise contamination utilizing a fixed filter design is to pass the seismic data through a notched filter. However, the use of such prior art notched filters often gives poor results. First, the notch might not be centered exactly at the frequency of the noise contamination. Second, the notch removes a considerable amount of the valid data along with the noise. Third, the contamination from the noise often extends to parts of the amplitude spectrum outside of the notch with the result that there is noise remaining in the data after the notch filter has been applied. Finally, in some cases, the notch filter can induce phase distortion in the data. Unlike fixed filters, adaptive filters, however, have the ability to adjust their own parameters automatically and their design requires little or no prior knowledge of signal or noise characteristics. See, for example, U.S. Pat. No. 3,889,108 issued to Cantrell.

Noise cancelling is a variation of optimal filtering where a reference input is filtered and subtracted from a primary input containing both signal and noise to attenuate or eliminate primary noise by cancellation. Bernard Widrow et al, "Adaptive Noise Cancelling: Principles and Applications", *Proceedinos of the IEEE*, Vol. 63, No. 12, December 1975, describe a method of using a "primary" input containing the corrupted signal and a "reference" input containing noise correlated in some way with the primary noise where the reference input is adaptively filtered and subtracted from the primary input to obtain the signal estimate.

The adaptive noise cancellation apparatus described by Widrow et al may be seen by reference to FIG. 1. The primary input is assumed to be any kind of signal—stochastic, deterministic, periodic, transient, etc.—or any combination of signals. The reference input is assumed to be a pure cosine wave $C \cos(\Omega_0 t + \Phi)$. The primary and reference inputs are sampled at a sampling frequency of $2\pi/T$ radians/second. The reference input is sampled directly, giving $x_{1k}$, and after undergoing a 90 degree phase shift, giving $x_{2k}$. The sampled reference inputs are provided to the basic element of the Widrow adaptive noise cancelling system—an LMS adaptive filter, the principal component of which is an adaptive linear combiner for weighting and summing a set of input signals to form a output signal. The LMS adaptive algorithm is designed to adjust the weights of the adaptive linear combiner to minimize mean-square error. Operating as an implementation of the method of steepest descent, the LMS algorithm adaptively supplies estimations of the amplitudes of reference inputs $x_{1k}$ and $x_{2k}$. Similar apparatus may be seen by reference to Bernard Widrow and S. D. Stearns, *Adaptive Signal Processing*, Prentice-Hall, Inc., 1985, pgs. 99–116 and 316–337; and J. R. Glover, *Adaptive Noise Cancellino of Sinusoidal Interference*, Stanford University dissertation published by University Microfilms International, 1986, pgs. 30–34 and 64–72.

Widrow et al sought to apply noise cancellation to remove nonstationary sinusoidal noise contaminating a primary signal. In Widrow et al, however, the contaminating sinusoid was also available as a separate signal. To accomplish the objective using two external signals, it was necessary to adjust only the amplitude and phase of the sinusoidal signal to match that found in the primary signal. This objective was readily satisfied by adjusting the two amplitudes of the quadrature components of the sinusoidal signal. Widrow et al are silent, however, as to any teaching or suggestion of permitting the frequency or phase of the quadrature components of the sinusoidal signal to change.

The problem which arose during attempts to apply the teachings of Widrow to seismic applications was that there was no recording available for the contaminating sinusoid. Attempts were made to employ a synthetic sinusoidal signal to approximate the contaminating sinusoid. It was felt that this might be successful if the contaminating frequency could be estimated from a spectral analysis of the seismic recording. This implementation worked, however, only if the frequency did not change appreciably—e.g. the two frequencies never deviated by more than 1 or 2 percent over the duration of the seismic recording. Since this condition cannot always be satisfied, the Widrow technique has proven unsatisfactory for many seismic applications.

SUMMARY OF THE INVENTION

It is an object of this invention to provide an adaptive feedback control system for phase locking a communication system.

It is another object of this invention to provide a method and apparatus for locking the frequency and phase of a local oscillator with that of a like constituent of a external signal.

The output of a local oscillator to be locked to the frequency and phase of an external signal is subtracted from the external signal to produce a resultant signal known as the feedback error signal. The feedback error signal is utilized to modify the output of the local oscillator by adjusting phase, frequency and amplitude parameters of the quadrature components which comprise the output signal of the local oscillator. The modified output signal of the local oscillator is again subtracted from the external signal to produce a modified feedback error signal. A series of modified feedback error signals are produced so that the phase, frequency and amplitude parameters of the quadrature components will be continuously adjusted, thereby producing a series of modified local oscillator output signals until the frequency and phase of the local oscillator signal is locked to that of external signal.

The above and other objects, advantages and features of the invention will be more readily understood from the following detailed description of the invention, which is provided in connection with the accompanying drawings.

BRIEF DESCRIPTION OF THE DRAWINGS

FIG. 1 is a block diagram of a prior art adaptive noise cancelling circuit;

FIG. 2 is a block diagram of the adaptive noise cancelling circuit of the present invention;

FIG. 5a illustrates the input spectral plot of the contaminated input signal "d(K)" of FIG. 4a;

FIG. 5b illustrates the output spectral plot for the error signal "e(K)" for the input signal of FIG. 4a once phase-locking has been achieved in accordance with the methods of the present invention;

FIG. 6a illustrates the contaminated input signal "d(K)" for Example 2;

FIGS. 6b and 6c illustrate local quadrature reference signals "xa(K)" and "xb(K)", respectively, to be utilized in cancelling the sinusoidal noise component of the contaminated input signal of FIG. 6a in accordance with the methods of the present invention;

FIG. 6d illustrates the estimated sinusoidal noise component y(K) for the contaminated input signal of FIG. 6a determined in accordance with the methods of the present invention;

FIG. 6e illustrates the error or noise cancelled signal "e(K)", which approximates the data component of the contaminated input signal of FIG. 6a, determined in accordance with the methods of the present invention;

DESCRIPTION OF THE PREFERRED EMBODIMENT

Turning first to FIG. 2, the adaptive noise cancelling circuit of the present invention may now be seen. Here, the contaminated input signal d(K) represents the input signal s(K) containing the sinusoidal component n(K) and may be described according to Equation (1) below as:

$$d(K) = s(K) + n(K) \quad (1)$$

where:
  n(K)=nonstationary sinusoidal part of the input signal with amplitude, phase, and frequency changing with time;
  s(K)=portion of input signal assumed to be uncorrelated with n(K); and
  K=0, 1, 2, 3, . . . ,L (sampling index for process).

The modeled or estimated signal after phase-locking has been achieved is represented as y(k) and is defined according to Equation (2) below:

$$y(K) = ya(K) + yb(K) = A^*xa(K) + B^*xb(K) \quad (2)$$

where:
  A, B=filter weights to be adjusted with time—i.e., with each value of K; and
  xa(K) and xb(K) are quadrature reference inputs which may be further defined as:

$$xa(K) = c^*sin(2^*PI^*F^*K^*dt + THETA + PHI) \quad (3)$$

$$xb(K) = c^*cos(2^*PI^*F^*K^*dt + THETA + PHI) \quad (4)$$

where:
  c=constant amplitude part for xa and xb and can be set to one without loss of generality;
  dt=sampling interval;
  F=frequency in hertz to be adjusted with time—i.e., with K;

THETA = phase correction term to be applied whenever F is adjusted;

PHI = relative phase to be adjusted with time.

The instantaneous error is represented as e(K) and is defined according to Equation (5) below:

$$e(K) = d(K) - y(K) \tag{5}$$

After phase-locking has been achieved, the following relationships will be true:

$$y(K) = n(K) \tag{6}$$

$$e(K) = s(K) \tag{7}$$

where:
- y(K) = the modeled or estimated sinusoidal component of the signal after phase-locking has been achieved, and
- e(K) = the remainder of the input signal after removing the nonstationary, sinusoidal component of the signal.

Figure 3A:
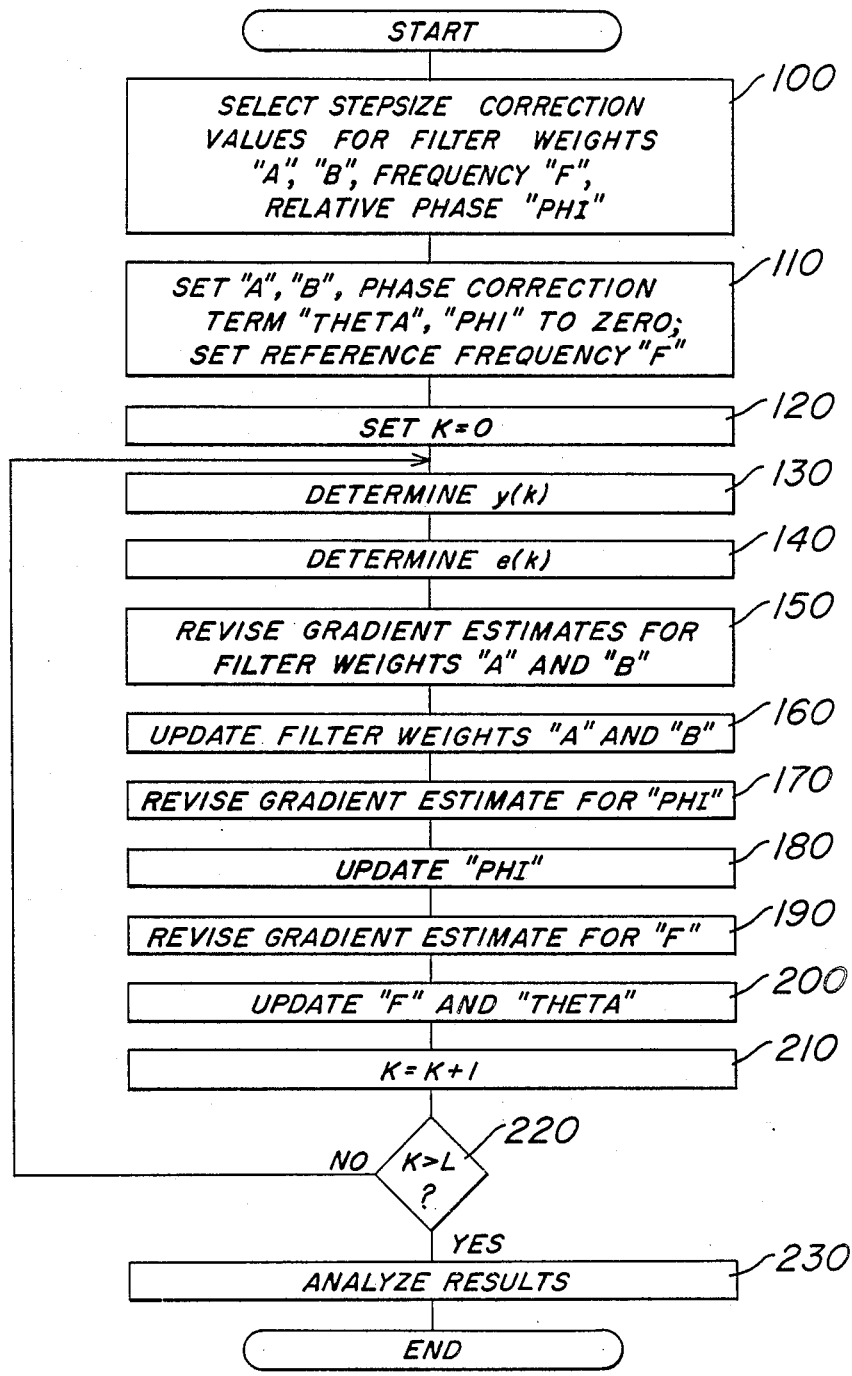
FIG. 3a illustrates, in flow chart form, the forward pass portion of the method of cancelling narrow-band, nonstationary sinusoidal noise from seismic data of the present invention.

Turning next to FIG. 3a, the method of cancelling narrow-band, nonstationary sinusoidal noise from seismic data of the present invention commences at step 100 by selecting stepsize correction values for filter weights "A" and "B". These values must be greater than zero and less than unity in accordance with the well known steepest-descent method that proceeds in the direction of the negative gradient. For example, a typical stepsize which has proven satisfactory for use would be stepsize correction values of 0.01 for filter weights "A" and "B" Generally, the stepsize correction value selected should always be conservative—e.g. one percent or less of the adjustment that could be made based solely on the gradient.

Also at step 100, stepsize values for frequency "F" and relative phase "PHI" must be selected as well. Contrary to conventional teachings, the stepsize values selected for "F" and "PHI" cannot be positive values in accordance with the negative gradient requirement set forth by the aforementioned steepest descent method. In accordance with the teachings of the present invention, the corrections for "F" and "PHI" are applied in the preceding stage than the stage where filter weights "A" and "B" are adjusted according to the negative gradient requirement. Accordingly, it has been discovered that for frequency "F" and phase "PHI", stepsize correction values less than zero must be selected. For example, a typical stepsize value which has proven satisfactory for use would be −0.01 for frequency "F" and relative phase "PHI". Since it can be confusing to the user to choose both positive and negative stepsizes, without loss of generality we will adopt a convention which uses the positive gradient requirement whenever "F" and "PHI" are being revised. By doing so we can now proceed on the basis that the stepsizes for "F" and "PHI" will always be greater than zero just as we have done for the stepsizes for A and B.

Proceeding to step 110, initial values for filter weights "A" and "B", phase correction term "THETA" and relative phase "PHI" are set to zero. Reference frequency "F" is set to the approximate frequency of the sinusoidal noise component. If unknown, the approximate frequency of the sinusoidal noise component may be determined by any conventional means. As shown by Example 1, the selected approximation of reference frequency "F" differed from the actual sinusoidal noise component frequency by 11 percent without adverse effect. At step 120, sampling index "K" is set to zero.

Proceeding to step 130, the modeled or estimated signal y(K) is determined according to the Equation (2):

$$y(K) = ya(K) + yb(K) = A*xa(K) + B*xb(K) \tag{2}$$

Proceeding to step 140, the instantaneous error e(K) is determined according to the Equation (5):

$$e(K) = d(K) - y(K) \tag{5}$$

where: d(K) is the input signal containing the nonstationary sinusoidal component.

Proceeding to step 150, estimates of the gradients for filter weights "A" and "B" are determined according to the following equations, obtained by squaring Equation (5) and computing the partial derivatives with respect to A and B:

$$grad\_A = -e(K)*xa(K) \tag{8}$$

$$grad\_B = -e(K)*xb(K) \tag{9}$$

where: the factor of two omitted in these equations will be absorbed in the stepsize parameters in Equations (10) and (11) and, at step 160, the values for filter weights "A" and "B" are updated using the gradient estimates determined at step 150. New values for filter weights "A" and "B" are determined according to the equations:

$$A(new) = A(old) + Stepsize\_A*(-grad\_A) \tag{10}$$

$$B(new) = B(old) + Stepsize\_B*(-grad\_B) \tag{11}$$

Proceeding to step 170, the estimate of the gradient for the relative phase "PHI" is revised according to the following equation, obtained by squaring Equation (5) and computing the partial derivative with respect to PHI:

$$grad\_PHI = -e(K)*(A*xb(K) - B*xa(K)) \tag{12}$$

where: the factor of two omitted in this equation will be absorbed in the stepsize parameter in Equation (13) and at step 180, the relative phase PHI is updated according to Equation (13) below:

$$PHI(new) = PHI(old) + Stepsize\_PHI*(+grad\_PHI) \tag{13}$$

where:
"Stepsize_PHI" represents the fractional change permitted for revising relative phase "PHI" based on an estimation of its gradient.

Proceeding to step 190, the estimate for the frequency gradient may now be revised according to Equation (14) below, obtained by squaring Equation (5) and computing the partial derivative with respect to F:

$$grad\_F = -e(K)*(A*xb(K) - B*xa(K)) \tag{b 14}$$

where: the factor of two and the factor of 2*PI*K*dt omitted in this equation will be absorbed in the stepsize parameter in Equation (15) and, at step 200, the frequency F and phase correction term THETA are updated according to the following:

$$F(new) = F(old) + Stepsize\_F*(+grad\_F) \tag{15}$$

where:

"Stepsize_F" represents the fractional change permitted for revising frequency "F" based on this definition for estimating its gradient.

Relative phase "THETA" may now be revised so that the relative phase will be properly time-tied with the preceding sample—i.e. sample K−1. Relative phase "THETA" is revised according to Equation (16) below:

$$THETA(new) = THETA(old) + 2*PI*K*dt*(-F(old) - F(new)) \quad (16)$$

At step 210, the value of K is incremented by 1 for either forward computation or computation in real time. At step 220, K is compared to L, when L is assumed to be the last sample. If K is less than or equal to L, the method of the present invention returns to step 130 for further iterations. If K is greater than L, the method of the present invention proceeds to step 230 where the results are analyzed. If the results are unsatisfactory, then the process could be repeated for a different set of parameters at step 100. Also, if the onset transient is undesirable, then the flow chart in FIG. 3b would be used for further processing.

The above-described method is intended to process permanently recorded seismic data in the forward direction with respect to time. The recorded data may, however, be processed in the backward direction with respect to time, as well. The capability of forward and backward processing can be used to prevent the unwanted onset transient that occurs when the data is initially processed. The transient occurs because it takes a finite amount of time at the onset of processing for certain parameters to build-up from zero to their proper values. To avoid such undesirable transient behavior, it is often necessary to make two passes over the data. The data are first processed in a given direction and the final parameter values are saved. Then these final values are used to initialize the parameters in preparation for the second pass which now proceeds in the opposite direction.

Figure 3B:
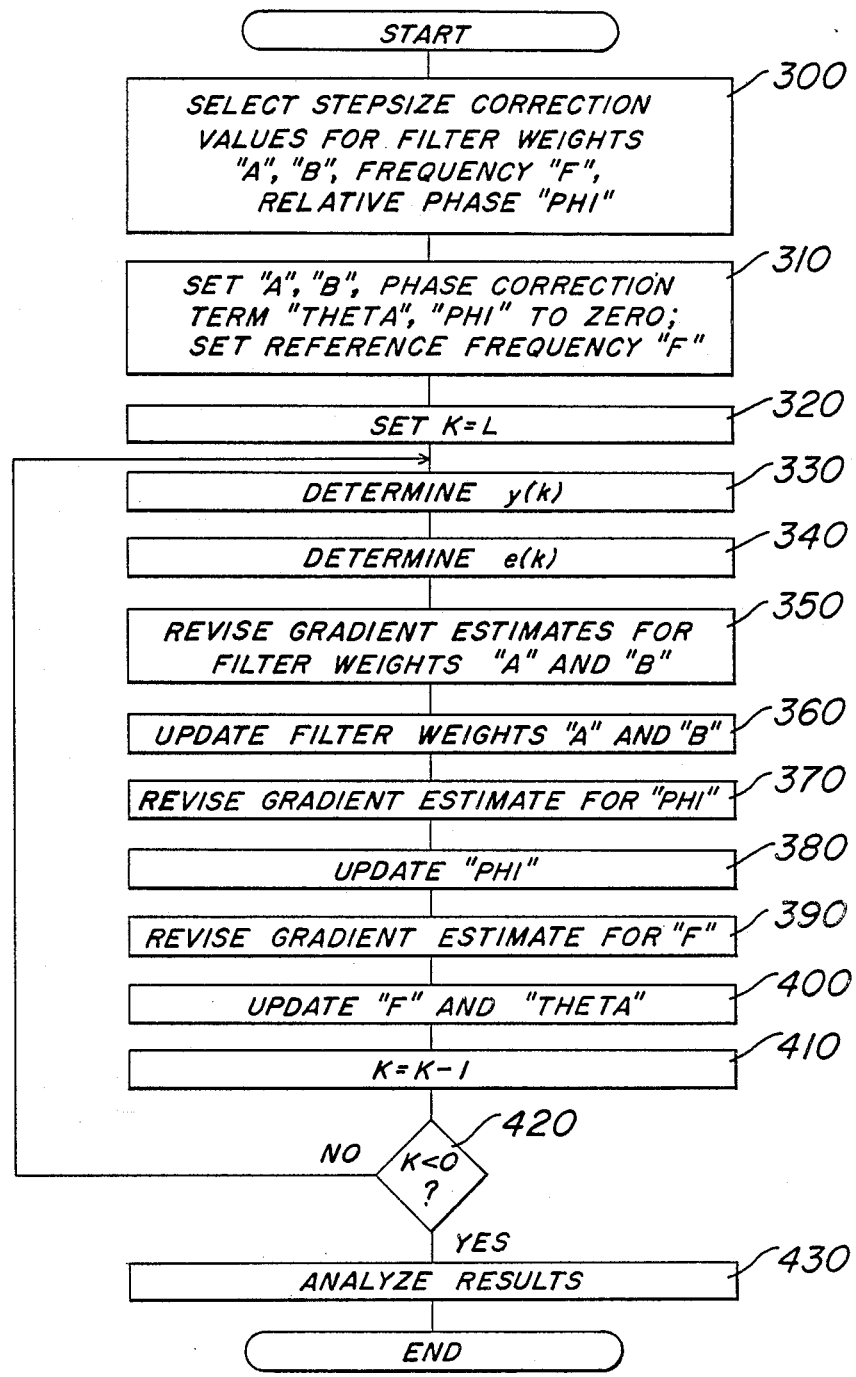
FIG. 3b illustrates, in flow chart form, the backward pass portion of the method of cancelling narrow-band, nonstationary sinusoidal noise from seismic data of the present invention.

Turning next to FIG. 3b, the second, or backward pass is now described. The backward pass commences at step 300 by selecting stepsize correction parameters. These values may be those previously selected for the forward pass with the exception that Stepsize_"F" must now have the opposite sign from that sign used in FIG. 3a. This follows because we are now processing in the direction of negative time. Rather than burden the user with this detail, we can without loss of generality insure that the proper sign on the stepsize for "F" will be used by merely including a switch which is controlled by the direction of processing.

Proceeding to step 310, filter weights "A" and "B", phase correction term "THETA", elative phase "PHI", and frequency "F" are set to the values determined during the previously performed forward pass. At step 320, sampling index "K" is set to L.

Proceeding to step 330, the modeled or estimated signal y(K) is determined according to Equation (17):

$$y(K) = ya(K) + yb(K) = A*xa(K) + B*xb(K) \quad (17)$$

where:

$$xa(K) = c*sin(2*PI*F*K*dt + THETA + PHI) \quad (18)$$

$$xb(K) = c*cos(2*PI*K*dt + THETA + PHI) \quad (19)$$

Proceeding to step 340, the instantaneous error e(K) is again determined according to Equation (20):

$$e(K) = d(K) - y(K) \quad (20)$$

Proceeding to step 350, estimates of the gradients for filter weights "A" and "B" are determined according to the following equations:

$$grad\_A = -e(K)*xa(K) \quad (21)$$

$$grad\_B = -e(K)*xb(K) \quad (22)$$

and, at step 360, the values for filter weights "A" and "B" are updated using the gradient estimates determined at step 350. New values for filter weights "A" and "B" are determined according to the equations:

$$A(new) = A(old) + Stepsize\_A*(-grad\_A) \quad (23)$$

$$B(new) = B(old) + Stepsize\_B*(-grad\_B) \quad (24)$$

Proceeding to step 370, the estimate of the gradient for the relative phase "PHI" is revised according to the following equation:

$$grad\_PHI = -e(K)*(A*xb(K) - B*xa(K)) \quad (25)$$

and at step 380, the relative phase PHI is updated according to Equation (26) below:

$$PHI(new) = PHI(old) + Stepsize\_PHI*(+grad\_PHI) \quad (26)$$

Proceeding to step 390, the estimate for the frequency gradient may now be revised according to Equation (27) below.

$$grad\_F = -e(K)*(A*xb(K) - B*xa(K)) \quad (27)$$

and, at step 400, the frequency F and phase correction term THETA are updated according to the following:

$$F(new) = F(old) + Stepsize\_F*(+grad\_F) \quad (28)$$

Relative phase "THETA" may now be revised so that the relative phase will be properly time-tied with the preceding sample—i.e. sample k+1. Relative phase "THETA" is revised according to Equation (29) below:

$$THETA(new) = THETA(old) + 2*PI*K*dt*(-F(old) - F(new)) \quad (29)$$

At step 410, the value of K is decreased by 1. At step 420, K is compared to zero. If K is not less than zero, the method of the present invention returns to step 330 for further iterations. If K is less than zero, the method of the present invention proceeds to step 430 where the results are analyzed.

The following examples of cancelling the sinusoidal noise component of a contaminated input signal comprised of a data component and a sinusoidal noise component are presented to demonstrate the utility of the invention. Two examples, one which utilizes synthetic data and the other which utilizes seismic data are to be presented. The example utilizing synthetic data, which is set forth below as Example 1, was such that the data component was predicted prior to cancellation of the sinusoidal noise component of the contaminated noise signal in accordance with the methods of the present invention. As such, Example 1 is presented as verification of the success of the method of the present invention. Example 2, which utilized seismic data taken from a field example, clearly indicates the success of the present invention in achieving the aforementioned objectives.

EXAMPLE 1

Figure 4B:
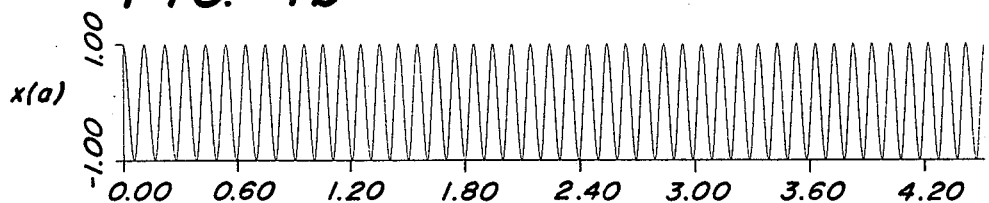
FIGS. 4b and 4c illustrate local quadrature reference signals "xa(K)" and "xb(K)", respectively, to be utilized in cancelling the sinusoidal noise component of the contaminated input signal of FIG. 4a in accordance with the methods of the present invention.
Figure 4C:
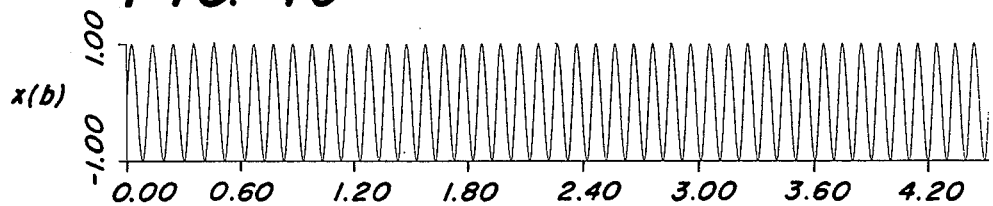
Figure 4A:
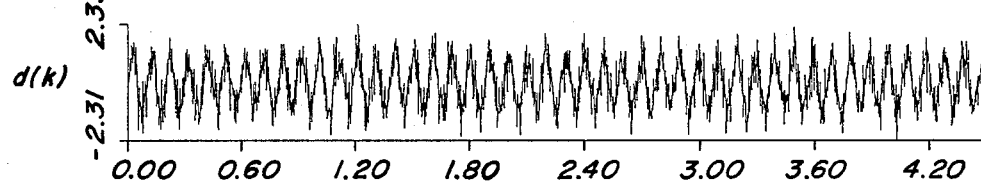
FIG. 4a illustrates the contaminated input signal "d(K)" for Example 1.

As may be seen by reference to FIG. 4a, a synthetic recording was constructed for the contaminated input signal d(K) by combining a band-limited (0–250 h) gaussian signal and a sinusoidal signal at 10.1 hz. The combination of the sinusoidal noise component and the data component was performed in a manner such that the sinusoidal noise signal contributed twice as much power as the gaussian signal to the contaminated input signal. The ratio of the power of the gaussian signal to that of the combined signal was, therefore, $1/(1+2)=0.333$. This ratio was selected as the smallest that could be expected from any noise-cancelling experiment. In order to demonstrate the phase-locking as well as the noise cancelling features of my invention, the method was performed utilizing the stepsize parameters set forth above and with the initial frequency set to 9 hz. The forward pass, time varying waveforms for these conditions may be seen by reference to FIGS. 4b–e.

Figure 4D:
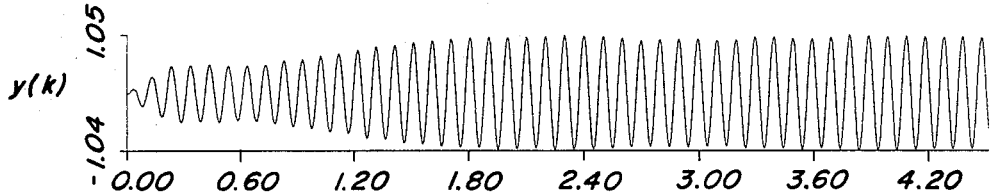
FIG. 4d illustrates the estimated sinusoidal noise component y(K) for the contaminated input signal of FIG. 4a determined in accordance with the methods of the present invention.
Figure 4E:
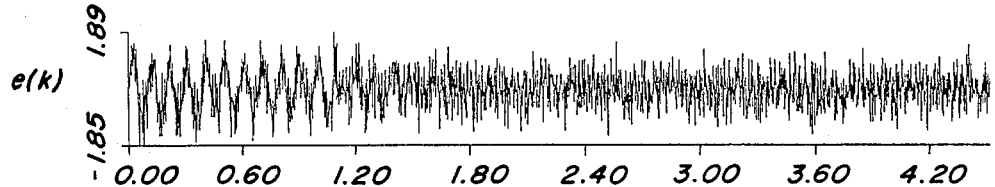
FIG. 4e illustrates the error or noise cancelled signal "e(K)", which approximates the data component of the contaminated input signal of FIG. 4a, determined in accordance with the methods of the present invention.

Referring to FIG. 4d, it may be seen that phase-locking and, hence, noise cancellation was achieved after about 1.8 seconds. This fact can be qualitatively observed from FIG. 4d by noting that both the amplitude and frequency of the modeled signal y(K) were stabilized after 1.8 seconds. For a more quantitative measure of phase-locking and noise cancellation, FIGS. 5a–b are also provided. FIGS. 5a–b illustrate the input and output spectral plots once phase-locking was achieved and computed over a 2–6 second time window. An examination of FIGS. 5a–b clearly indicates that the 10.1 hz signal was removed from the output spectrum without noticeably affecting the remainder of the input spectrum.

In performing the noise cancellation experiment, the initial approximation of the sinusoidal noise component frequency differed from the actual sinusoidal noise component frequency by 11 percent. Despite such a large difference between the approximated and actual frequencies, cancellation of the sinusoidal noise component from the contaminated trace was successful. Reliance on prior knowledge of the contaminating sinusoid was therefore greatly minimized when the frequency and phase of local reference signals xa(K) and xb(K) were updated in accordance with the methods described herein. Conversely, further experimentation indicated that, when the frequency and relative phase of the local reference signals xa(K) and xb(K) were not updated in accordance with the teachings of my invention and instead only the filter weights of the local reference signals were updated, practically no noise cancellation of the contaminated input signal was observed if the frequency of the sinusoidal noise component was approximated as 9 Hz and the actual frequency was 10.1 Hz. If, however, the initial approximation of the reference frequency was changed from 9 to 10 hz., which is now within 1% of the actual frequency (10.1 Hz.) of the sinusoidal noise component, effective noise cancellation was observed without updating of the frequency and relative phase of the local reference signal xa(K) and xb(K).

EXAMPLE 2

As may be seen by reference to FIG. 6a, a seismic trace known to be contaminated with a nonstationary sinusoidal signal at approximately 60.55 Hz was chosen as the contaminated input signal d(K). To remove this contaminant, the reference frequency was chosen to be 60 Hz. The resultant sinusoidal noise component and seismic data component may be seen in FIGS. 6d and 6e, respectively. Referring to FIG. 6d, it may be seen that the noise cancellation method was quite effective after the initial onset transient of approximately 0.8 seconds. Having removed the undesirable sinusoidal noise signal y(K), which represented approximately 41% of the power contained in the input signal d(K), one could now study the seismic signal e(K) for its intended purpose. Further study indicated that the output spectrum was practically identical to the input spectrum except where the 60.55 Hz component of the input signal had been removed by the noise-cancelling process of the present invention.

Figure 7:
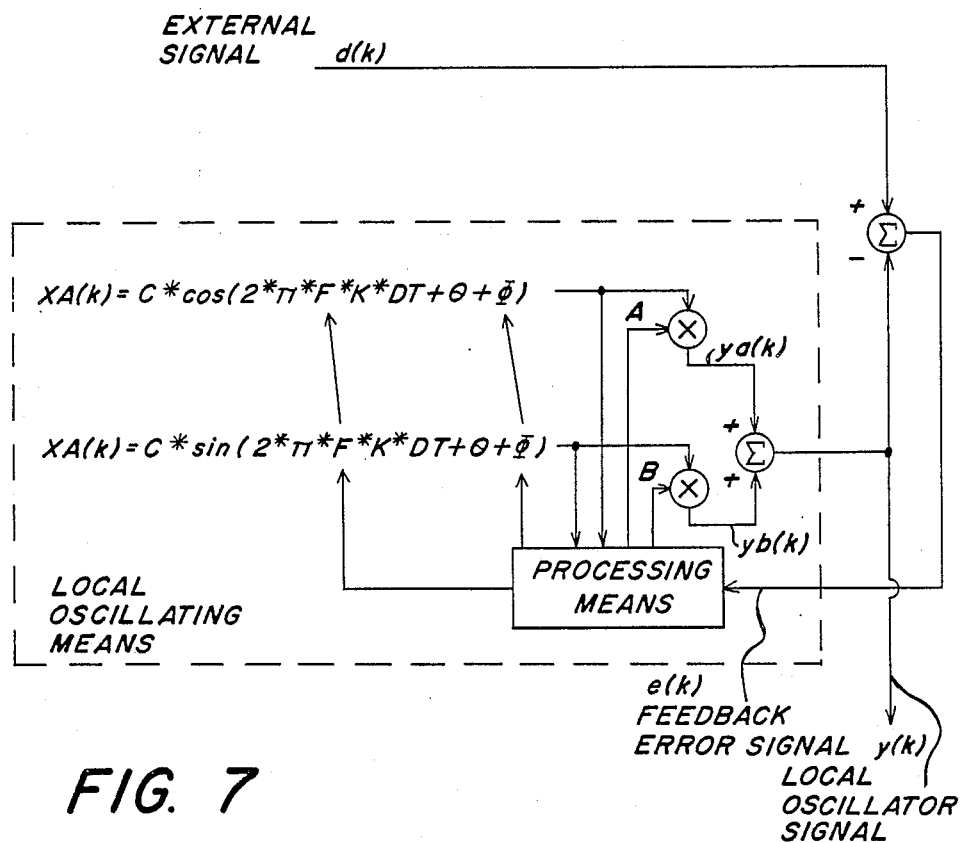
FIG. 7 is a block diagram of the frequency and phase locking circuit of the present invention.

It is my further invention that the methods and apparatus for cancelling the sinusoidal noise component of a contaminated input signal described herein may also be utilized to lock the frequency and phase of a local oscillator with the frequency and phase of an external signal. A block diagram of the frequency and phase locking circuit of the present invention may be seen by reference to FIG. 7. Here, apparatus for locking the phase and frequency of the output y(K) of local oscillator means to the frequency and phase of an external signal d(K) is illustrated. Local oscillator signal y(K) is applied to external signal d(K) to produce a feedback error signal e(K). The feedback error signal e(K) is utilized to adjust frequency, phase, and amplitude parameters of quadrate inputs which comprise output local oscillator signal y(K) until the frequency and phase of y(K) is locked to that of external signal d(K).

Figure 8:
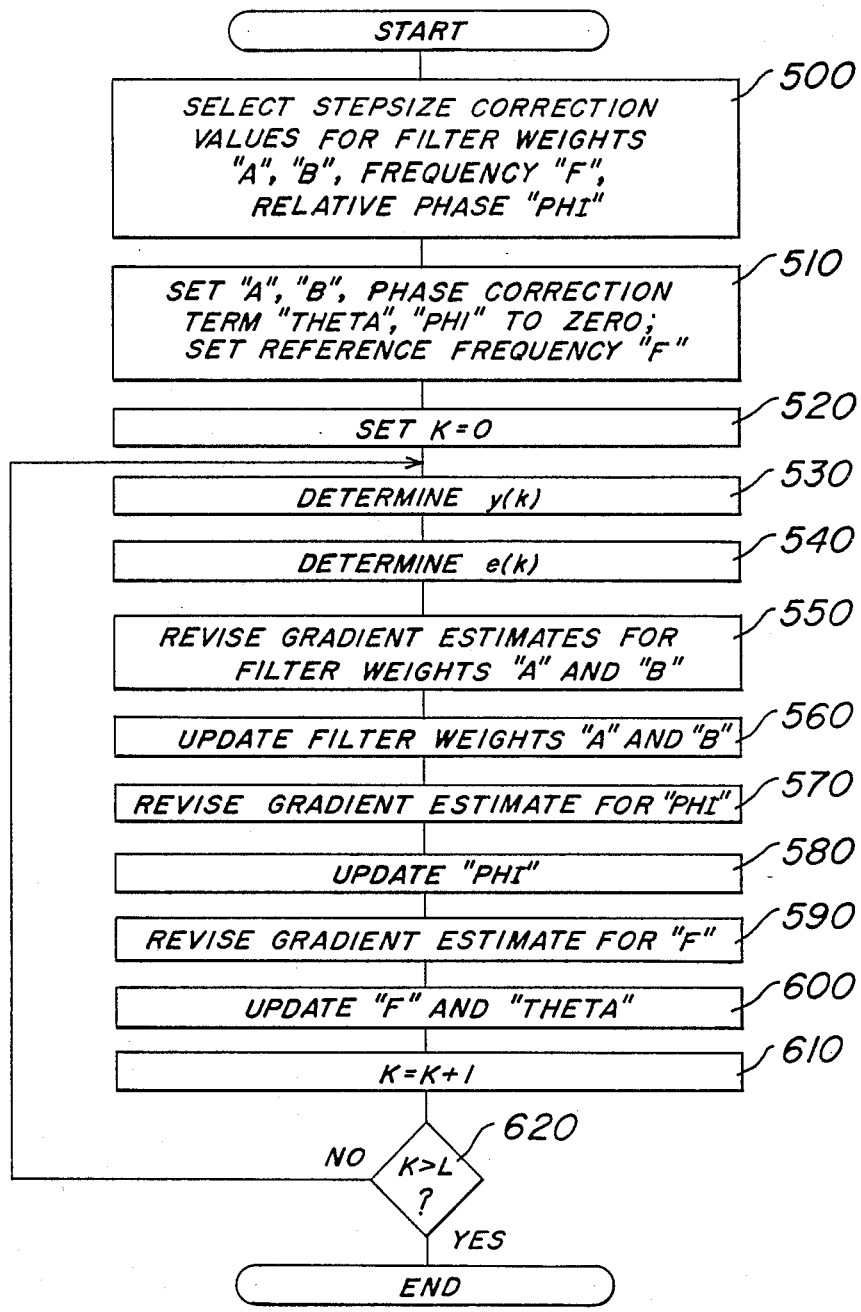
FIG. 8 illustrates, in flow chart form, the method of phase locking a local oscillator with the phase and frequency of an external signal of the present invention.

Turning next to FIG. 8, the method of locking the frequency and phase of a local oscillator with that of an external signal commences at step 500 by selecting stepsize correction parameters The magnitudes of these values must be greater than zero and less than unity in accordance with the well known steepest-descent method that proceeds in the direction of the negative gradient. For example, a typical stepsize magnitude which has proven satisfactory for use would be stepsize values of 0.01 for filter weights "A" and "B" and stepsize values of $-0.01$ for frequency "F" and relative phase "PHI"

Proceeding to step 510, filter weights "A" and "B", phase correction term "THETA" and relative phase "PHI" are set to zero. Reference frequency "F" is set to the approximate frequency of the narrow-band component—i.e., to use for phase-locking—of the external band component. At step 520, sampling index "K" is set to zero.

Proceeding to step 530, the local oscillator output signal y(K) is provided. Output signal y(K) which may be represented as Equation (30):

$$y(K)=ya(K)+yb(K)=A^*xa(K)+B^*xb(K) \qquad (30)$$

where:

A, B=filter weights to be adjusted with time—i.e., with each value of K; and xa(K) and xb(K) are quadrature components of the local oscillator output signal and are defined:

$$xa(K) = c*\sin(2*PI*F*K*dt + \text{THETA} + \text{PHI}) \quad (30a)$$

$$xb(K) = c*\cos(2*PI*F*K*dt + \text{THETA} + \text{PHI}) \quad (30b)$$

where:
K=0, 1, 2, 3, ..., L (sampling index for process)
c=constant amplitude for part for xa and xb and can be set to one without loss of generality;
dt=sampling interval;
F=frequency of local oscillator output signal to be locked over time to external signal;
THETA=phase correction term to be applied whenever F is adjusted;
PHI=relative phase to be adjusted with time.

Proceeding to step 540, the feedback error signal e(K) is determined according to the Equation (31):

$$e(K) = d(K) - y(K) \quad (31)$$

where: d(K) is the external signal, the phase and frequency of which y(K) is to be locked to.

Proceeding to step 550, estimates of the gradients for filter weights "A" and "B" are determined according to the following equations, obtained by squaring equation (31) and computing the partial derivatives with respect to A and B:

$$\text{grad\_}A = -e(K)*xa(K) \quad (32)$$

$$\text{grad\_}B = -e(K)*xb(K) \quad (33)$$

where: the factor of two omitted in these equations will be absorbed in the stepsize parameters in Equations (34) and (35) and, at step 560, the values for filter weights "A" and "B" are updated using the gradient estimates determined at step 550. New values for filter weights "A" and "B" are determined according to the equations:

$$A(\text{new}) = A(\text{old}) + \text{Stepsize\_}A*(-\text{grad\_}A) \quad (34)$$

$$B(\text{new}) = B(\text{old}) + \text{Stepsize\_}B*(\text{'grad\_}B) \quad (35)$$

Proceeding to step 570, the estimate of the gradient for the relative phase "PHI" is revised according to the following equation, obtained by squaring Equation (31) and computing the partial derivative with respect to PHI:

$$\text{grad\_PHI} = -e(K)*(A*xb(K) - B*xa(K)) \quad (36)$$

where: the factor of two omitted in this equation will be absorbed in the stepsize parameter in Equation (37) and at step 580, the relative phase PHI is updated according to Equation (37) below:

$$\text{PHI(new)} = \text{PHI(old)} + \text{Stepsize\_PHI}*(+\text{grad\_PHI}) \quad (37)$$

where:
"Stepsize PHI" represents the fractional change permitted for revising relative phase "PHI" based on an estimation of its gradient.

Proceeding to step 590, the estimate for the frequency gradient may now be revised according to Equation (38) below, obtained by squaring Equation (31) and computing the partial derivative with respect to F:

$$\text{grad\_}F = -e(K)*(A*xb(K) - B*xa(K)) \quad (38)$$

where: the factor of two and the factor of 2*PI*K*dt omitted in this equation will be absorbed in the stepsize parameter in Equation (39) and, at step 600, the frequency F and phase correction term THETA are updated according to the following:

$$F(\text{new}) = F(\text{old}) + \text{Stepsize\_}F*(+\text{grad\_}) \quad (30)$$

where:
Stepsize F" represents the fractional change permitted for revising frequency "F" based on this definition for estimating its gradient.

Relative phase "THETA" may now be revised so that the relative phase will be properly time-tied with the preceding sample—i.e. sample k-1. Relative phase "THETA" is revised according to Equation (31) below:

$$\text{THETA(new)} = \text{THETA(old)} + 2*PI*K*dt*(F(\text{old}) - F(\text{new})) \quad (31)$$

At step 610, the value of K is incremented by 1 for either forward computation or computation in real time. At step 620, K is compared to L. If K is less than or equal to L, the method of the present invention returns to step 530 for further iterations. If K is greater than L, the frequency and phase of the local oscillator signal y(K) has been locked to that of external signal d(K). Upon locking, the method of the present invention ends.

Thus, there has been described and illustrated herein apparatus and methods for cancelling nonstationary sinusoidal noise from seismic data. However those skilled in the art will recognize that many modifications and variations besides those specifically set forth may be made in the techniques described herein without departing substantially from the concept of the present invention. Accordingly, it should be clearly understood that the form of the invention described herein is exemplary only, and is not intended as a limitation on the scope of the claims.

Thus, there has been described and illustrated herein apparatus and methods for cancelling nonstationary sinusoidal noise from seismic data. However those skilled in the art will recognize that many modifications and variations besides those specifically set forth may be made in the techniques described herein without departing substantially from the concept of the present invention. Accordingly, it should be clearly understood that the form of the invention described herein is exemplary only, and is not intended as a limitation on the scope of the claims.

What is claimed is:

1. A method for phase locking an output of a local oscillator with an external signal, said output produced from amplitude, frequency and phase parameters, comprising the steps of:
   applying said local oscillator output signal to said external signal to produce a feedback error control signal;
   adjusting said amplitude, frequency and phase parameters based on said feed back error control signal;
   producing a modified local oscillator output signal from said adjusted amplitude, frequency and phase parameters;
   repeating the steps of applying said local oscillator output signal to said external signal to produce a modified feedback error control signal, adjusting said amplitude, frequency and phase parameters based one said modified feedback error control signal, and producing a next modified local oscillator output signal from said adjusted amplitude, frequency and phase parameters until said next modified local oscillator output signal is phased locked with said external signal;

providing a first pair of components of said local oscillator output signal, said pair of components separated by ninety degrees, said pair of components produced using a pair of amplitude parameters, a frequency parameter, and a phase parameter; and summing said pair of components to produce said output signal from said local oscillator.

2. The method according to claim 1 wherein said first pair of components obey the following relationships:

$$xa(K) = \sin(2*PI*F*K*dt + THETA + PHI)$$

$$xb(K) = \cos(2*PI*F*K*dt + THETA + PHI)$$

where:
dt = sampling interval;
F = frequency (hertz);
K = sampling index;
THETA = phase correction term to be applied whenever F is adjusted;
PHI = relative phase to be adjusted with time.

3. The method according to claim 1 wherein the step of producing a next modified local oscillator output signal from said adjusted amplitude, frequency and phase parameters further comprises the steps of:

providing a next pair of components of said local oscillator output signal, said next pair of components separated by ninety degree, said pair of components produced using said next pair of amplitude parameters, said next frequency parameter, and said next phase parameter; and summing said next pair of components to produce said modified output signal from said local oscillator.

4. The method according to claim 5 wherein said next pair of components obey the following relationships:

$$xa(K) = \sin(2*PI*F*K*dt + THETA + PHI)$$

$$xb(K) = \cos(2*PI*F*K*d + THETA + PHI)$$

where:
dt = sampling interval
F = frequency (hertz);
K = sampling index;
THETA = phase correction term to be applied whenever F is adjusted;
PHI = relative phase to be adjusted with time.

5. Apparatus for phase locking an output signal of a local oscillator with an external signal comprising:

means for producing an oscillating signal from amplitude, frequency and phase parameters;

means for comparing said oscillating signal to said external signal; and means for modifying said amplitude, frequency and phase parameters utilized to produce said oscillating signal based one said comparison of said oscillating signal and said external signal;

wherein said amplitude, frequency and phase parameters are repeatably modified based on said comparison of said oscillating signal and said external signal and said produced oscillating signal is continuously adjusted based on said modification of said amplitude, frequency and phase parameters until said oscilling signal is locked to said external signal; and means for producing a pair of signal components separated by ninety degrees, said pair of signals components produced utilizing said modified amplitude, frequency and phase parameters;

wherein said means for producing said oscillating signal sums said pair of signals components to produce said oscillating signal.

6. Apparatus according to claim 5 wherein said means for comparing said oscillating signal to said external signal further comprises means for subtracting said oscillating signal from said external signal.

7. A method for phase locking an output of a local oscillator with an external signal, said output produced from amplitude, frequency and phase parameters, comprising the steps of:

selecting an amplitude step, a phase step and a frequency step;

making an initial estimate of said amplitude, frequency and phase parameters;

producing a initial pair of signal components separated by ninety degrees utilizing said initial estimates of said amplitude, frequency and phase parameters;

summing said initial pair of signal components to produce said oscillator output signal;

applying said local oscillator output signal to said external signal to produce a feedback error control signal;

estimating gradients for said amplitudes based upon said feedback error control signal and said initial pair of signal components;

adjusting said amplitude parameter estimates based upon said amplitude step, said amplitude gradients and said estimated amplitude parameters;

estimating a gradient for said phase based upon said feedback error control signal, said initial pair of signal components and said adjusted amplitude parameters;

adjusting said phase parameter based upon said phase step, said phase gradient and said estimated phase parameter;

estimating a gradient for said frequency based upon said feedback error control signal, said initial pair of signal components and said adjusted amplitude parameters;

adjusting said frequency parameter based upon said frequency step, said frequency gradient and said estimated frequency parameter;

producing a modified local oscillator output signal from said adjusted amplitude, frequency and phase parameters;

repeating the steps of applying said local oscillator output signal to said external signal to produce a modified feedback error control signal, adjusting said amplitude, frequency and phase parameters, and producing a modified local oscillator output signal from said adjusted amplitude, frequency and phase parameters until said modified local oscillator output signal is locked with said external signal.

8. The method according to claim 7 wherein said amplitude step is selected to be +0.01 and said phase and frequency steps are selected to be −0.01.

9. The method according to claim 7 wherein said gradients for said amplitudes are estimated according to the following:

$$\text{grad} = -e(K)*x(K)$$

where:

grad = grad_A, grad_B;
e(K) = feedback error control signal; and
x(K) = a pair of signal components.

10. The method according to claim 7 wherein said amplitude parameters are adjusted according to the following:

$$A(\text{new}) = A(\text{old}) + \text{Stepsize\_}A*(-\text{grad\_}A)$$

$$B(\text{new}) = B(\text{old}) + \text{Stepsize\_}B*(-\text{grad\_}B).$$

11. The method according to claim 7 wherein said gradients for said phase and frequency are estimated according to the following:

$$\text{grad} = -e(K)*(A*xb(K) - B*xa(K))$$

where:

grad = grad_PHI, grad_F;
e(K) = feedback error control signal;
A = first of said pair of amplitude parameters;
xa(K) = first of said pair of signal components;
B = second of said pair of amplitude parameters; and
xb(K) = second of said pair of signal components.

12. Method according to claim 7 wherein said phase is adjusted according to the following:

$$\text{PHI(new)} = \text{PHI(old)} + \text{Stepsize\_PHI}*(+\text{grad\_PHI}).$$

13. Method according to claim 7 wherein said frequency is adjusted according to the following:

$$F(\text{new}) = F(\text{old}) + \text{Stepsize\_}F*(+\text{grad\_}F).$$

* * * * *

UNITED STATES PATENT AND TRADEMARK OFFICE
CERTIFICATE OF CORRECTION

PATENT NO. : 4,857,867
DATED : August 15, 1989
INVENTOR(S) : Paul G. Griffith

It is certified that error appears in the above-identified patent and that said Letters Patent is hereby corrected as shown below:

Col.1, line 39, "Visually" should read -- visually --

Col.2, line 15, "Proceedinos" should read -- Proceedings --

Col.2, line 46, "Cancellino" should read -- Cancelling --

Col.7, line 18, "!30" should read -- 130 --

Col.9, line 10, "(0-250 h)" should read -- (0-250 hz) --

Col.12, line 8, "(+grad_)" should read -- (+grad_F) --

Col.13, line 2, "one" should read -- on --

Col.13, line 47, "xb(K) = cos(2*PI*F*K*d" should read

-- xb(K) = cos(2*PI*F*K*dt --

Col.14, line 4, "oscilling" should read -- oscillating --

Signed and Sealed this

Seventeenth Day of July, 1990

Attest:

HARRY F. MANBECK, JR.

*Attesting Officer*    *Commissioner of Patents and Trademarks*